(12) United States Patent
Casarsa

(10) Patent No.: US 7,941,715 B2
(45) Date of Patent: May 10, 2011

(54) ASYNCHRONOUS SET-RESET CIRCUIT DEVICE

(75) Inventor: Marco Casarsa, Vaprio d'Adda (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 504 days.

(21) Appl. No.: 11/759,625

(22) Filed: Jun. 7, 2007

(65) Prior Publication Data

US 2007/0300116 A1 Dec. 27, 2007

(30) Foreign Application Priority Data

Jun. 8, 2006 (EP) ..................................... 06011821

(51) Int. Cl.
*G01R 31/28* (2006.01)
*H03K 19/00* (2006.01)

(52) U.S. Cl. ........................ 714/724; 714/726; 326/16

(58) Field of Classification Search .................. 714/726, 714/738, 729, 724, 718, 733, 727, 741, 731, 714/30; 716/4

See application file for complete search history.

(56) References Cited

U.S. PATENT DOCUMENTS

| | | | | |
|---|---|---|---|---|
| 3,835,337 A * | 9/1974 | Foltz | ............................ | 327/203 |
| 4,441,075 A * | 4/1984 | McMahon | .................... | 714/731 |
| 4,728,823 A * | 3/1988 | Kinoshita | ...................... | 326/41 |
| 4,894,557 A * | 1/1990 | Beltramini | ..................... | 327/217 |
| 4,941,050 A * | 7/1990 | Bird | .............................. | 348/735 |
| 5,379,302 A * | 1/1995 | Andrews | ....................... | 714/727 |
| 5,416,784 A * | 5/1995 | Johnson | ........................ | 714/733 |
| 5,440,569 A * | 8/1995 | Naito | ............................ | 714/726 |
| 6,226,774 B1 * | 5/2001 | Sawasaki et al. | ................. | 716/1 |
| 6,393,592 B1 * | 5/2002 | Peeters et al. | ................. | 714/731 |
| 6,429,698 B1 * | 8/2002 | Young | ............................. | 327/99 |
| 2004/0124881 A1 * | 7/2004 | Thadikaran et al. | ........... | 326/93 |

FOREIGN PATENT DOCUMENTS

JP 60029680 2/1985
JP 62226071 10/1987

OTHER PUBLICATIONS

Wehrfritz, C. H., "Techniques for the Transformation of Logic Equations", May 1974, IEEE Transactions on Computers, vol. c-23, No. 5. pp. 477-480.*

* cited by examiner

*Primary Examiner* — Robert Beausoliel
*Assistant Examiner* — Daniel F McMahon
(74) *Attorney, Agent, or Firm* — Lisa K. Jorgenson; Allen, Dyer, Doppelt, Milbrath & Gilchrist, P.A.

(57) ABSTRACT

An asynchronous set-reset circuit device for testing activity performed by an Automatic Test Patterns Generation tool may include a pair of logic gates having at least two inputs each, and a logic gate structure coupled upstream from the pair of logic gates. The logic gate structure may be for driving one respective input of the pair of logic gates and may have inputs receiving a pair of test command signals. The asynchronous set-reset circuit device may also include a plurality of feedback connections between outputs of the pair of logic gates and respective inputs of the logic gate structure.

15 Claims, 4 Drawing Sheets

ASYNCHRONOUS SET-RESET CIRCUIT DEVICE

FIELD OF THE INVENTION

The present invention relates to an asynchronous set-reset circuit device, for example, a latch component. More specifically, a circuit device is provided that may improve the quality requirement and reduce the patterns generation time in testing activity normally performed by an Automatic Test Patterns Generation (ATPG) tool.

BACKGROUND OF THE INVENTION

As may be appreciated by a person of ordinary skill in the art, the complex System-on-Chip (SoC) architectures developed in recent years may used with an ATPG tool to obtain the high quality production desired by the customer, and at the same time, to also obtain reduction of the generation time for the patterns. In other words, a designer of complex integrated circuit architecture, such as a SoC, may be assisted in testing activity by an ATPG tool that automatically generates the test patterns for the scan testing.

Scan testing may provide an efficient approach for testing the structural integrity of electronic devices, such as flip-flops and the logic gates among the circuit flip-flops, within a complex integrated circuit. Scan testing may not test integrated circuit-level functionality; however, test personnel may use scan testing to confirm that individual flip-flops and the logic gates among flip-flops within an integrated circuit are functioning properly.

Typically, complex integrated circuits may be designed and implemented as a series of interconnected functional blocks, each of which can be tested independently. Basic devices, such as flip-flops, can be connected together in a scan path to support scan testing. Flip-flops within a scan chain structure have their output connected to the input of a subsequent flip-flop. The first flip-flop within a scan path receives its input from an automated test unit through a test access port on the chip. The last flip-flop within a scan path provides its output to the automated test unit through a test access port.

Flip-flops may be taken from a library of basic cells available to the designer for building up a more complex chain structure. For a better understanding, analysis of a classical case illustrated in FIG. 1 concerning a standard library cell (LR1QLL), substantially an SR latch, follows below.

The test coverage that can be obtained using an ATPG tool with this kind of components is the following. Test coverage =0% (6 faults, 10 MOS), where 10 MOS is just an indication of the number of possible transistors forming the cell. The test coverage evaluations reported hereinbelow have been performed using a combinational ATPG algorithm because it may be commonly used to reduce the overall test pattern vectors and generation time. Using a sequential ATPG algorithm, of course, the coverage can be higher, but we may lose the advantage of reduced test vector generation and patterns count.

This means that with this approach, the cell 1 is described using a behavioral model, which may not be understood by the combinational ATPG tool algorithm that cannot detect faults. The problem in this respect may be the null coverage of the cell itself and also the problem of a low test coverage for the logic core observed by the SET-RESET inputs and a similar low test coverage for the logic core controlled by the output Q. So, the above basic cell may be considered by the ATPG tool as a black box, and for this reason, it is strongly suggested to avoid its use during the design activity.

Looking now at the CMOS schematic of the cell 1, it worthwhile to note that it is possible to describe that standard cell LR1QLL in more detail by making reference to FIG. 2, wherein a NAND-NAND structure is illustrated. As an alternative, a dual approach including a NOR-NOR structure may be taken in consideration.

So, referring to FIG. 2, a couple of two-input NAND gates 2 and 3 receive a Set or Reset command on a corresponding input terminal and present each respective output feedback cross-connected to the other input terminal of the other NAND gate. The output of the first NAND gate 2 is connected to the input of an inverter for providing at the inverter output the Q output value.

This representation of the LR1QLL cell illustrated in FIG. 2 may offer a set of faults, which is more realistic (more linked to the real physical defects) since the structural view is more equivalent to the transistor view.

In this specific case, the test coverage may be obtained using a combinational ATPG tool and is the following:

test coverage=~64% (22 faults, 10 MOS)

Also in this case, the test coverage is lower than the expected one. This may be due to the fact that the structure has a feedback loop (the cross connection between the NAND gates) that may prevent the ATPG tool from completely controlling/observing any node of the cell. As a consequence, the coverage of the input/output logic core may be lower than the target coverage.

A further possible approach is illustrated in FIG. 3, a structure 10 is provided by the prior art to overcome the problem of using a synchronous flip-flop with an asynchronous SET-RESET pin inserted in a scan chain. This approach comprises substituting the SR latch with a synchronous flip-flop having a set-reset asynchronous initialization. Moreover, this synchronous flip-flop 10 may use additional logic gates 6 and 7 to control the asynchronous SET-RESET pins from external pads or dedicated test modes during the ATPG control phase, since the inputs SET and RESET may be enabled in a mutually exclusive way.

SUMMARY OF THE INVENTION

An object of the invention is providing a more efficient asynchronous set-reset circuit device having structure and functional features allowing for reductions of the global time of the design activity while improving the test coverage of the whole circuit architecture.

An approach comprises defining a common architecture to improve the test coverage of designs, which may use the set-reset asynchronous architecture. These components could be used with two different objects: simplification of the design phase, and reduction of power consumption.

According to the above approach, an asynchronous set-reset circuit device for testing activity performed by an ATPG tool is provided. The asynchronous set-reset circuit device may include a pair of logic gates having at least two inputs each, and a logic gate structure coupled upstream from the pair of logic gates. The logic gate structure may be for driving one respective input of the pair of logic gates and may have inputs receiving a pair of test command signals. The asynchronous set-reset circuit device may also include a plurality of feedback connections between outputs of the pair of logic gates and respective inputs of the logic gate structure.

The features and advantages of the circuit device according to the present invention result from the following description given by way of non-limiting example with reference to the enclosed drawings.

DETAILED DESCRIPTION OF THE PREFERRED EMBODIMENTS

Figure 4:
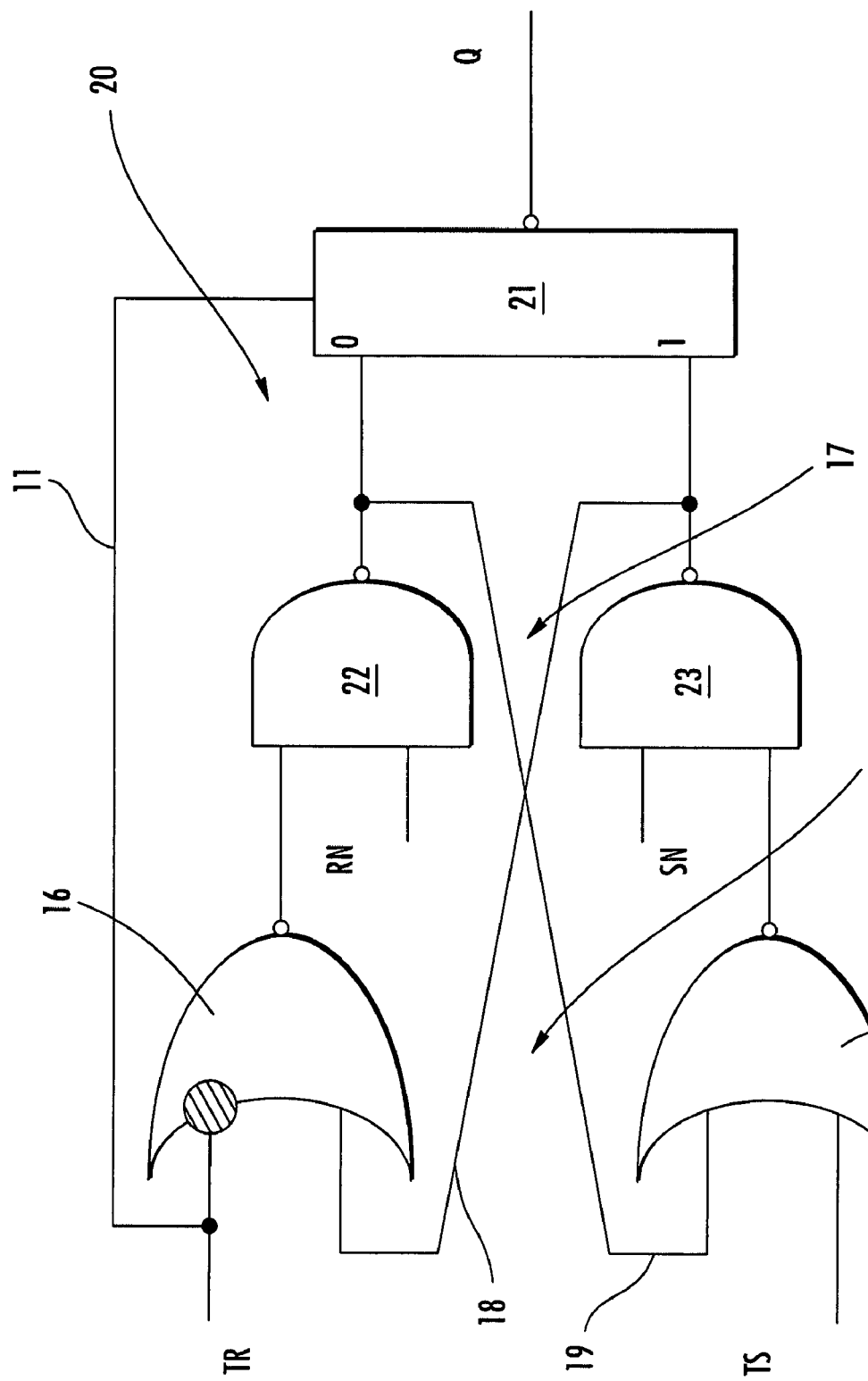
FIG. 4 is a schematic view of an asynchronous set-reset circuit device according to the present invention.

Referring to FIG. 4, an asynchronous set-reset circuit device 20 is disclosed. The circuit device 20 has been provided for improving the quality requirement and reducing the patterns generation time in the design activity using an Automatic Test Patterns Generation (ATPG) tool. The circuit device is used as a basic circuit structure in a library, for example, a library of a "Verilog" design tool.

Figure 1:
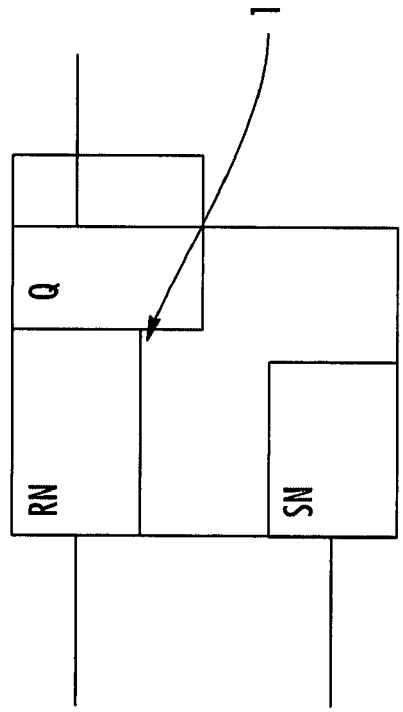
FIG. 1 is a schematic view of a simple SR latch cell according to the prior art.
Figure 2:
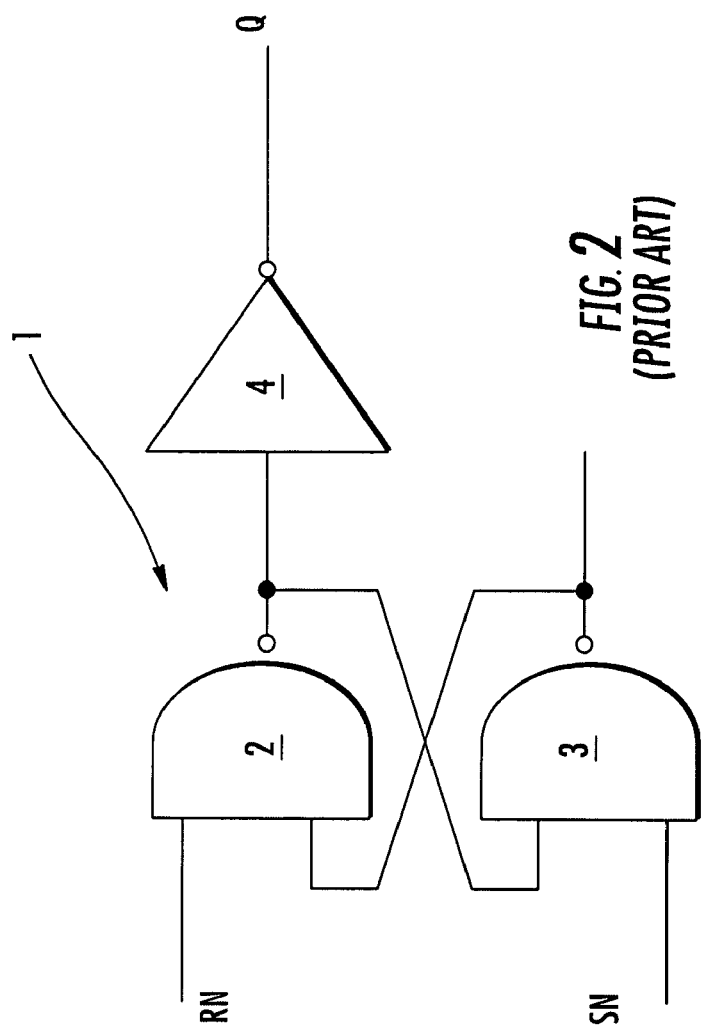
FIG. 2 is a detailed schematic view of the internal structure of the latch cell of FIG. 1, according to the prior art.

The circuit device 20 is derived from the basic structure illustrated in FIG. 2, but includes structural and functional features that may allow for the improvement of the controllability and observability of the asynchronous set-reset component. The circuit device 20 comprises a NAND-NAND structure 17 including a double NAND gate with at least two inputs for each gate 22 and 23. Again, a possible alternative structure to the NAND-NAND structure would include a NOR-NOR structure.

Differently from the prior art, a logic gate structure 8 is upstream with respect to the NAND-NAND structure 17. More specifically, one input of the first NAND gate 22 is connected to the output of a logic gate 16, in particular, a NOR gate. This NOR gate 16 has a first input receiving a command signal TR (Test Reset) and a second input connected through a link 18 to the output of the second NAND gate 23.

Similarly, a second logic gate 15 is upstream provided with respect to the second NAND gate 23. In particular, this second logic gate 15 is a second NOR gate having a first input receiving a command signal TS (Test Set) and a second input connected through a link 19 to the output of the first NAND gate 22. The output of the NOR gate 15 is linked to one input of the second NAND gate 23.

The second input of the first NAND gate 22 receives a reset signal RN while the second input of the second NAND gate 23 receives a set signal SN. Both the outputs of the first and the second NAND gates 22, 23 are linked to a selective and inverting Multiplexer 21 providing a single output Q for the circuit device 20. A connection 11 is provided between the multiplexer 21 and the first input of the NOR gate 16 for providing the signal TR also to the multiplexer 21.

As may be appreciated by the person of ordinary skill in the art, the feedback loop between the NAND gates 2 and 3 (FIG. 2) of the prior art approach has been broken in the circuit device 20 of this embodiment. These modifications may provide a combinational cell rather than a sequential cell of the prior art approach when the test mode is enabled.

Two new command test signal have been added to the circuit device 20: they are the signal TR (Test Reset) and TS (Test Set). The final test coverage of this cell 20 is the following: test coverage=97.6% (42 faults, 28 MOS) where 28 MOS is just an indicative number of the transistors used. The two test signals TR, TS are forced to GND during the normal functioning of the circuit device 20.

It is worth while to note that there could be a fault not covered by the ATPG tool and represented by a stuck-at 0 at the input of the NOR gate 16 connected to the TR pin (marked by a larger dot in FIG. 4). However, this fault may not affect in any way the functional behavior of the circuit because in the functional condition, it is already forced to GND, the same value of the untested stuck-at.

Figure 3:
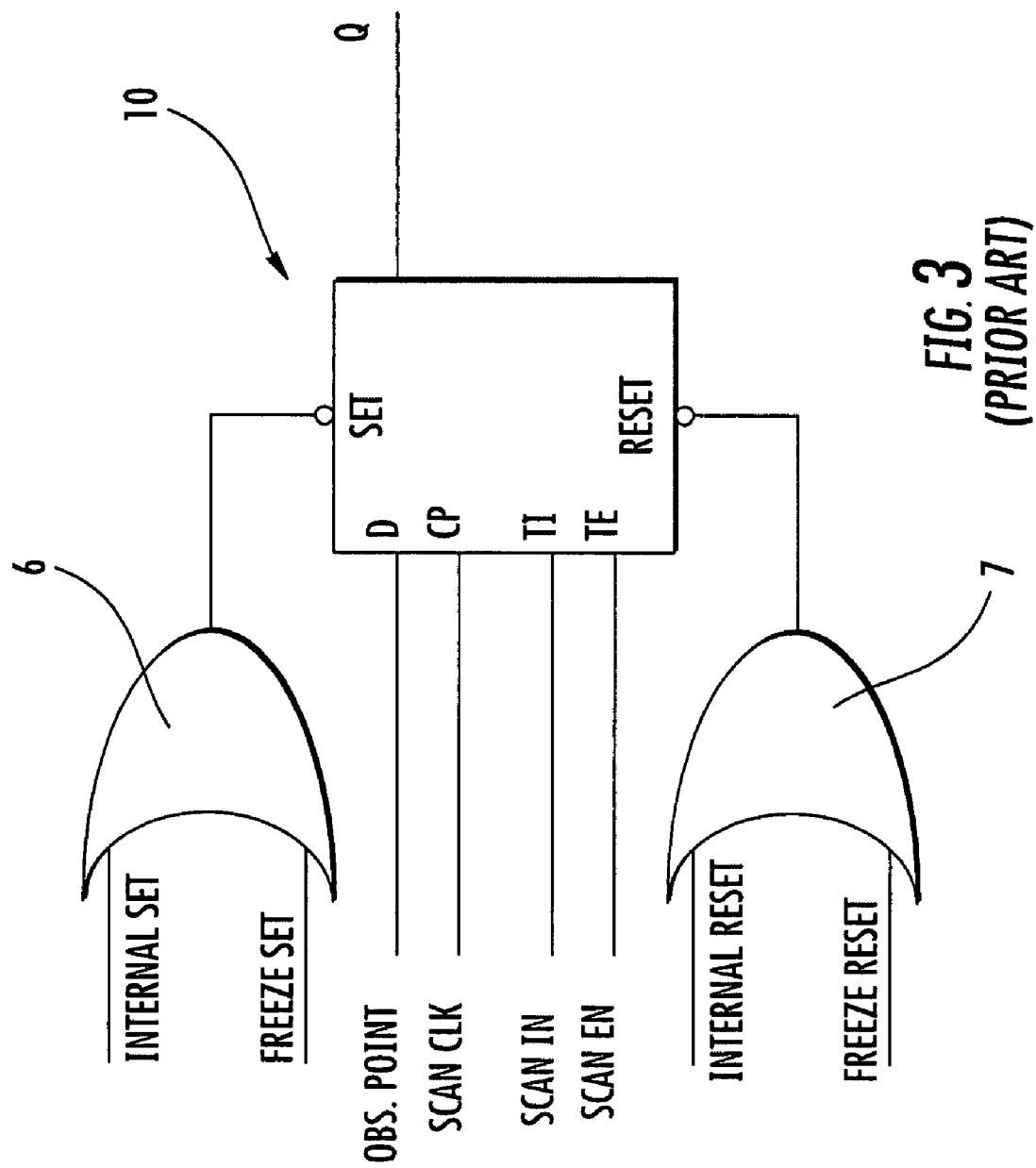
FIG. 3 is a schematic view of a complex circuit device according to the prior art, which includes a flip-flop.

The intrinsic high value of the test coverage of the cell formed by the circuit device 20 may allow for improving the whole test coverage of the input/output logic core. If compared to the original code (including 12 MOS), it has been the logic portion of the gates 15 and 16 that allow conversion of the basic and not testable cell of FIG. 2 into testable device. The final number of MOS transistor is twenty-eight in the library used by the Applicant. This value may be less than the prior art approach illustrated in FIG. 3 and relating to 44 MOS transistor, that was the simplest one with testable facilities.

Figure 5:
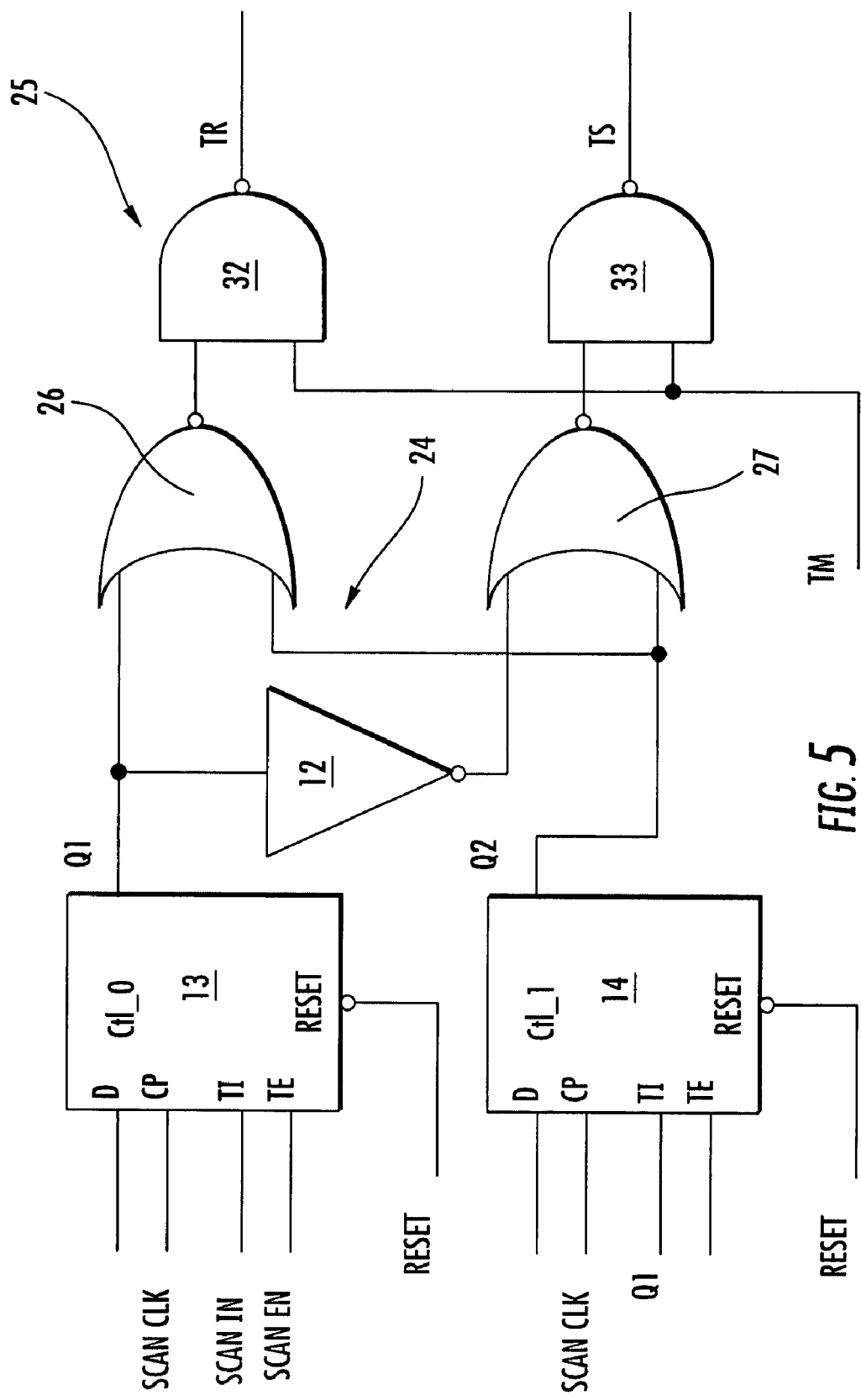
FIG. 5 is a schematic view of a test block circuit producing test signals applied to the asynchronous set-reset circuit device of the present invention.

The control test signals TS and TR may have to be directly controlled by external pads (this is the simplest controllability approach) or they can be managed by a dedicated test block circuit 25 like the one illustrated in FIG. 5 or they can be controlled from the pads replacing the Ql, Q2 signals. In this embodiment of the test block circuit 25, a couple of two inputs NAND gates 32, 33 may be provided for receiving respective driving signals from corresponding outputs of a logic network 24.

This logic network 24 includes a couple of NOR gates 26, 27 having both a couple of inputs, terminal one of which is linked to a corresponding output Q1, Q2 of a flip-flop cell 13, 14. Both the second inputs of the first and the second NAND gates 32, 33 are receiving a same command signal TM. An inverter may be provided between the first input of the first NOR gate 26, the one connected to the output Q1, and the other first input of the second NOR gate 27, the one connected to the output Q2.

The other second inputs of both the NOR gates 26, 27 are linked together. The first input of the NOR gate 26 is connected to the output 01 of a flip-flop cell 13. This cell 13 has four inputs D, CP, TI, TE and receives a reset signal Reset. However, the number of inputs of this cell may not be mandatory and other possible alternative approaches may be adopted for the flip-flip cell, for example, a cell having a set and an inverter on output could operate in the same manner.

The first input of the second NOR gate 27 is connected to the output Q2 of another flip-flop cell 14. This second cell 14 has four inputs D, CP, TI, TE and receives a reset signal Reset. The circuit behaves in the following way:

1) User Mode (TM =0)

In this operating mode, both the control signal TS and TR may be forced to GND to keep the original functionality of the Set-Reset asynchronous component 20 working as a latch.

2) Test Mode (TM =1)

In this operating mode, two scan flip-flops 13, 14 may be used to control the status of the TS, TR signals. If Ctl_1 has the value "1," both the control signals TS, TR are forced to VDD while when Ctl_1 has the value "0," the TS and TR values depend on the Ctl_0 status: TR is equivalent to Ctl_0 while TS has an opposite value. In this way, the ATPG tool may be able to break in any possible conditions for the internal feedback of the Set-Reset asynchronous latch.

Test Case Results

In order to check the quality of this approach, it has been applied to a real test case (the digital control block of an ADC), which was designed with the known basic LR1QLL cells of FIG. 2. The test of the design has been based on the implementation of the DFT structured scan architecture and implements scan chains including 346 Flip-Flops. The number of set-reset cells LR1QLL is 49, and the total number of faults is ~21 k (of course it depends on the model used for LR1QLL cell).

The test coverage has been evaluated applying the three different models described:

First case) the LR1QLL library cell with high level Verilog description.

Second case) the LR1QLL cell at gate level with internal structure.

Third case) the LR1QLL cell has been modified applying by the circuit device of this embodiment.

An important improvement in the test coverage has been noted in the passage from the first to the second and the third case. So, according to this embodiment, and without performing any modification from the functional point of view, the test coverage may be improved in a great percentage, and moreover, it may reduce the global time of the design activity used in case redesign of the design to be fully scan ready.

The person of ordinary skill in the art may understand that this asynchronous set-reset device may be implemented even with minor modifications all falling within the scope of the appended claims. For example, the NAND-NAND structure may be formed by a couple of NOR gates, and the associated logic network could be modified accordingly without departing from the principle of the invention.

That which is claimed:

1. An asynchronous set-reset circuit device for testing activity performed by an Automatic Test Patterns Generation tool and comprising:
a first pair of logic gates, each logic gate having first and second inputs;
a second pair of logic gates respectively coupled upstream from said first pair of logic gates, each logic gate of said second pair of logic gates having a first input configured to receive one of a pair of test command signals, a second input, and an output coupled to the respective first input of each logic gate of said first pair of logic gates;
a plurality of feedback connections coupled between outputs of said first pair of logic gates and the respective second inputs of said second pair of logic gates; and
a multiplexer coupled to the outputs of said first pair of logic gates and also coupled to at least one first input of said second pair of logic gates.

2. The asynchronous set-reset circuit device according to claim 1 wherein said second pair of logic gates comprises NOR gates.

3. The asynchronous set-reset circuit device according to claim 1 wherein the at least one first input of said second pair of logic gates being coupled to said multiplexer is also coupled to one of the pair of test command signals.

4. The asynchronous set-reset circuit device according to claim 1 further comprising a test circuit block outputting the pair of test command signals.

5. The asynchronous set-reset circuit device according to claim 4 wherein said test circuit block comprises a pair of two-input NAND gates and a logic network coupled thereto, each two-input NAND gate receiving respective driving signals from corresponding outputs of said logic network; and wherein the other inputs of said pair of two-input NAND gates receive a command signal.

6. The asynchronous set-reset circuit device according to claim 5 wherein said test circuit block further comprises a pair of flip-flop cells; wherein said logic network comprises a pair of 2-input NOR gates, each 2-input NOR gate having an input coupled to a corresponding output of said pair of flip-flop cells; and wherein the other inputs of each NOR gate of said pair of 2-input NOR gates are coupled together.

7. The asynchronous set-reset circuit device according to claim 6 wherein said logic network further comprises an inverter coupled between the inputs of said pair of 2-input NOR gates being coupled to the corresponding outputs of said pair of flip-flop cells.

8. An asynchronous set-reset circuit device for testing activity performed by an Automatic Test Patterns Generation tool and comprising:
a pair of NAND gates, each NAND gate having first and second inputs;
a pair of logic gates respectively coupled upstream from said pair of NAND gates, each logic gate of said pair of logic gates having a first input configured to receive one of a pair of test command signals, a second input, and an output coupled to the respective first input of each NAND gate of said pair of NAND gates;
a plurality of feedback connections coupled between outputs of said pair of NAND gates and the respective second inputs of said pair of logic gates; and
a multiplexer coupled to the outputs of said pair of NAND gates and also coupled to at least one first input of said pair of logic gates.

9. The asynchronous set-reset circuit device according to claim 8 wherein said pair of logic gates comprises NOR gates.

10. The asynchronous set-reset circuit device according to claim 8 wherein the at least one first input of said pair of logic gates being coupled to said multiplexer is also coupled to one of the pair of test command signals.

11. A method of making an asynchronous set-reset circuit device for testing activity performed by an Automatic Test Patterns Generation tool, the method comprising:
coupling a second pair of logic gates respectively upstream from a first pair of logic gates, each logic gate of the first pair of logic gates having first and second inputs, each logic gate of the second pair of logic gates having a first input configured to receive one of a pair of test command signals, a second input, and an output coupled to the respective first input of each logic gate of the first pair of logic gates;
coupling feedback connections between outputs of the first pair of logic gates and the respective second inputs of the second pair of logic gates ; and
coupling a multiplexer to the outputs of the first pair of logic gates and to at least one first input of the second pair of logic gates.

12. The method according to claim 11 wherein the second pair of logic gates comprises NOR gates.

13. The method according to claim 11 wherein the at least one first input of the second pair of logic gates coupled to the multiplexer is also coupled to one of the pair of test command signals.

14. An asynchronous set-reset circuit device for testing activity performed by an Automatic Test Patterns Generation tool and comprising:
a first pair of logic gates, each logic gate having first and second inputs;
a logic gate structure coupled upstream from said first pair of logic gates, said logic gate structure for driving the first inputs of each logic gate of said first pair of logic gates and having first inputs receiving a pair of test command signals and second inputs;

a plurality of feedback connections coupled between outputs of said first pair of logic gates and the respective second inputs of said logic gate structure; and a test circuit block outputting the pair of test command signals and comprising
- a pair of two-input NAND gates,
- a pair of two-input NOR gates coupled thereto, each two-input NAND gate receiving respective driving signals from corresponding outputs of said pair of two-input NOR gates, the other inputs of said pair of two-input NAND gates receiving a command signal, and
- a pair of flip-flop cells, each two-input NOR gate having an input coupled to a corresponding output of said pair of flip-flop cells,
- the other inputs of each NOR gate of said pair of two-input NOR gates being coupled together 15. The asynchronous set-reset circuit device according to claim 14 wherein said logic network further comprises an inverter coupled between the inputs of said pair of 2-input NOR gates being coupled to the corresponding outputs of said pair of flip-flop cells.

* * * * *

UNITED STATES PATENT AND TRADEMARK OFFICE
CERTIFICATE OF CORRECTION

Page 1 of 1

PATENT NO. : 7,941,715 B2
APPLICATION NO. : 11/759625
DATED : May 10, 2011
INVENTOR(S) : Casarsa It is certified that error appears in the above-identified patent and that said Letters Patent is hereby corrected as shown below:

| | |
|---|---|
| Column 1, Line 17 | Delete: "may used" <br> Insert: --may be used-- |
| Column 1, Line 48 | Delete: "this kind" <br> Insert: --these kinds-- |
| Column 2, Line 1 | Delete: "it" <br> Insert: --it is-- |
| Column 2, Line 66 | Delete: "of non-limiting" <br> Insert: --of a non-limiting-- |
| Column 4, Line 40 | Delete: "01" <br> Insert: --Q1-- |
| Column 4, Line 44 | Delete: "flip-flip" <br> Insert: --flip-flop-- |

Signed and Sealed this
Sixteenth Day of August, 2011

David J. Kappos
*Director of the United States Patent and Trademark Office*